United States Patent [19]

Cox et al.

[11] Patent Number: 4,717,448
[45] Date of Patent: Jan. 5, 1988

[54] REACTIVE ION ETCH CHEMISTRY FOR PROVIDING DEEP VERTICAL TRENCHES IN SEMICONDUCTOR SUBSTRATES

[75] Inventors: Randy D. Cox, Round Rock, Tex.; Arthur B. Israel, Colchester; Edward H. Payne, Essex Junction, both of Vt.

[73] Assignee: International Business Machines Corporation, Armonk, N.Y.

[21] Appl. No.: 917,131

[22] Filed: Oct. 9, 1986

[51] Int. Cl.[4] .................... B44C 1/22; H01L 21/308
[52] U.S. Cl. .................... 156/643; 156/646; 156/648; 156/651; 156/659.1; 156/662; 252/79.2
[58] Field of Search ............ 156/643, 646, 648, 649, 156/651, 659.1, 662; 252/79.1, 79.2; 29/576 W

[56] References Cited

U.S. PATENT DOCUMENTS

| | | | |
|---|---|---|---|
| 4,222,792 | 9/1980 | Lever et al. | 148/1.5 |
| 4,417,947 | 11/1983 | Pan | 156/643 |
| 4,450,042 | 5/1984 | Purdes | 156/643 |
| 4,475,982 | 10/1984 | Lai et al. | 156/643 |
| 4,533,430 | 8/1985 | Bower | 156/643 |
| 4,561,907 | 12/1985 | Raicu | 156/643 X |
| 4,569,718 | 2/1986 | Butherus et al. | 156/643 |
| 4,589,952 | 5/1986 | Behringer et al. | 156/646 X |
| 4,613,400 | 9/1986 | Tam et al. | 156/643 |

OTHER PUBLICATIONS

P. M. Schaible et al., "Reactive Ion Etching of Silicon," *IBM Technical Disclosure Bulletin*, vol. 22, No. 5, Oct. 1979, p. 1819.

*Primary Examiner*—S. Leon Bashore
*Assistant Examiner*—Andrew J. Anderson
*Attorney, Agent, or Firm*—Mark F. Chadurjian

[57] ABSTRACT

A process for forming deep ($>6\mu m$) trenches in a silicon substrate. The substrate is etched through a silicon oxide mask in a plasma having 75%–86% HCl, 9%–16% $O_2$, and 1%–8% $BCl_3$. The resulting trenches have substantially vertical sidewalls and rounded bottom surfaces. The plasma etch is performed at high power and low pressure, so that it achieves a high aspect ratio at a minimum etch bias.

18 Claims, No Drawings

REACTIVE ION ETCH CHEMISTRY FOR PROVIDING DEEP VERTICAL TRENCHES IN SEMICONDUCTOR SUBSTRATES

TECHNICAL FIELD

The invention relates to a specific chemistry for effecting deep trenches having substantially vertical sidewalls in semiconductor substrates.

BACKGROUND ART

In the formation of integrated circuits, it is often necessary to etch an aperture in a silicon substrate. In the past this substrate etch was used to define apertures which were filled with dielectric in order to provide isolation between adjacent devices. There was no particular criticality associated with the slope of the sidewalls of these apertures. Moreover, these apertures were not particularly deep (e.g., 2–3 $\mu$m).

In semiconductor memory technology, the trend toward packing more memory cells into a given chip area has led to the development of "three dimensional" or "trench" memory cells. In these cells, the charge plate of the storage capacitor is formed by one or more polysilicon layers and one or more dielectric layers that are coated within a deep (e.g., 5–6 $\mu$m) trench. The sidewalls of these deep trenches must be substantially vertical (i.e., have a slight positive taper x, where $88° < x < 90°$) in order to (a) minimize the amount of chip space consumed by the trench, and (b) present a topology that can be reliably coated with conductive and insulative films. Any etch process that is used to form deep trenches in silicon must provide a maximum "aspect ratio" (i.e., the vertical dimension of the trench should be at a maximum as compared to the horizontal dimension) while minimizing "etch bias" (i.e., the horizontal dimension of the trench should not be appreciably greater than the horizontal dimension of an aperture formed in a masking layer through which the trench is etched).

An article by Schaible et al, entitled "Reactive Ion Etching of Silicon," *IBM Technical Disclosure Bulletin*, Vol. 22, No. 5, October 1979 p. 1819, discloses the general idea of forming a trench in silicon by utilizing a $Cl_2/Ar$ reactive ion etch ("RIE") chemistry. By adding $CCl_4$ to the etch gas, a larger amount of $Cl_2$ can be used to increase the silicon etch rate without causing lateral etching of an n-type subcollector region.

U.S. Pat. 4,222,792 (issued 9/16/80 to Lever et al and assigned to the assignee of the present invention) discloses a process of forming a trench isolation region. The patent lists various techniques of forming a trench in a silicon substrate, namely $Cl_2/Ar$ or $CCl_4/Ar$ based RIE, fluorine based RIE such as $CF_4$, sputter etching or ion milling.

U.S. Pat. 4,417,947 (issued 11/29/83 to Pan and assigned to Signetics Corp.) relates to a process of controlling the slope of apertures formed in silicon by varying the oxygen content of a $CCl_4/O_2$ RIE. An anisotropic profile is achieved when there is no oxygen present.

U.S. Pat. 4,450,042 (issued 5/22/84 to Purdes and assigned to Texas Instruments) discloses a $BCl_3/Br_2$ plasma chemistry for anisotropic etching of silicon and silicon-containing compounds such as silicide. In general, the etch rate increased with increasing He (inert ion bombardment) in the presence of 8% $BCl_3$. The addition of bromine was found to be critical in that it passivated the sidewalls to increase the verticality of the etch.

U.S. Pat. 4,475,982 (issued 10/9/84 to Lai et al and assigned to the assignee of the present invention) relates to etching trenches through differentially-doped regions in a silicon substrate. Specifically, a $CCl_2$/argon RIE is used to etch lightly-doped regions, and a $CCl_2F_2$/oxygen RIE is used to etch more heavily-doped regions.

U.S. Pat. 4,569,718 (issued 2/11/86 to Butherus et al and assigned to AT&T) teaches the use of a $BCl_3/Cl_2$ etch chemistry to etch gallium arsenide.

As shown in the above art, the use of chlorine-based chemistries to etch trenches in silicon is known. However, it would be advantageous to have a particular chlorine-based etch chemistry that presents a maximum aspect ratio and a minimum etch bias for deep trenches formed in a silicon substrate.

SUMMARY OF THE INVENTION

It is thus an object of the invention to provide a plasma etch chemistry that will produce deep trenches in silicon substrates.

It is thus another object of the invention to provide a chlorine-based etch chemistry in which deep trenches may be formed in silicon substrates, the trenches having substantially vertical sidewalls.

It is yet another aspect of the present invention to provide a chlorine-based trench etch process that has a maximized aspect ratio at a minimum etch bias.

The foregoing and other objects of the invention are realized by a chlorine-based trench etch process that provides a maximum aspect ratio at a minimum etch bias. The etch chemistry comprises a combination of oxygen, hydrogen chloride, and boron trichloride. It has been found that the sidewalls of the etched trenches are substantially vertical and the bottoms of the etched trenches are rounded when the gas mixture includes more than 70% HCl in the presence of a small amount of $BCl_3$.

DESCRIPTION OF THE BEST MODE FOR CARRYING OUT THE INVENTION

The etch process of the present invention is carried out on a p+ type, <100> oriented silicon substrate that has a 2.5 $\mu$m thick p− type epitaxial layer disposed thereon. A layer of silicon oxide is formed on the epitaxial layer. The silicon oxide layer could be formed by any one of a number of known techniques (e.g., oxidation of the wafer by exposure to steam or dry $O_2$ at high temperature, chemical vapor deposition, etc). Whichever way the oxide layer is formed, its thickness should be in the range of 300 nm. The reasons for this critical thickness will be explained below.

A photosensitive polymer is then applied to the surface of the silicon oxide layer. Any one of a number of known photoresists could be used here. The photoresist is patterned to expose selected areas of the silicon oxide layer and then the exposed portions of the silicon oxide layer are removed to expose underlaying portions of the silicon substrate. It is preferred that dry etch techniques be used to pattern the oxide layer, so as to form apertures therein having vertical profiles. Any etch chemistry (or combination of etch chemistries) that would etch the oxide layer in an anisotropic mode could be used. In the invention, a two-step etch process is used. In the first step, a $CF_4$ RIE (400 V d.c. bias, 20 mT pressure, 100 SCCM gas flow) is used to pattern the silicon oxide layer, and then a brief $O_2$ RIE (800 W power, 35 mT pressure, 50 SCCM gas flow) is used to remove any residual polymers that may have redeposited from the photoresist.

It should be noted that of the above-described process parameters, the thickness of the silicon oxide layer is of primary importance. As will be explained below, the trench etch includes a small percentage of oxygen. The oxygen will attack the photoresist above the silicon oxide layer, substantially removing it during the trench etch. Therefore, although the etch rate ratio of silicon oxide to silicon is in the order of 50:1 during the trench etch, the silicon oxide layer must be thick enough so that it is not totally eroded during the trench etch. Therefore, in order to form a 6.5 μm deep trench, the silicon oxide layer should not be less than 100 nm. In practice, a 300 nm layer is used.

A series of trial runs were attempted leading up to the trench etch chemistry of the invention. The process conditions for significant ones of these trial runs are reproduced in Table 1 below. The specifics of the trial runs will be discussed with reference to Table 1, as follows:

tion. It is omitted from the other etch processes listed in Table 1 purely for the sake of clarity.

In order to understand the sequence of test runs leading up to the invention, a description will now be made of the myriad of problems that were presented by the initial $BCl_3/Cl_2$ trench etch. The sidewalls of the trenches were "irregular" in that they did not have a uniform slope. In general, the slope of the sidewalls varied as a function of depth. The sidewalls should have a constant near-vertical slope that does not vary as a function of depth. At least some of the trenches exhibited a "dovetail" trench bottom, wherein the bottom of the trench had a convex, semi-hemispherical shape. This convex shape is the inverse of the concave, rounded trench bottom that is desired in order to maximize trench filling by eliminating void formation in the filler material. That is, a dovetailed trench bottom would be difficult to reliably cover with layers to be subsequently coated within the trench. Some of the trenches exhibited "black silicon" formation on the trench bottom. "Black silicon" results when a reaction byproduct such as boron oxide is redeposited on the etched surface. These small particles form miniature etch masks in that they will not be removed in the

| Trial | $BCl_3$ (SCCM) | $Cl_2$ (SCCM) | HCl (SCCM) | $O_2$ (SCCM) | $Ar-O_2$ (SCCM) | D.C. Bias (Volts) | Pressure (mTorr) | Results |
|---|---|---|---|---|---|---|---|---|
| 1 | 50 | 0 | 0 | 0 | 0 | −200 | 20 | |
| 1 | 15 | 50 | 0 | 0 | 0 | −350 | 10 | irregular sidewall profiles; dovetailing at trench bottom; formation of black silicon; nonuniformity across wafer. |
| 44 | 15 | 50 | 0 | 0 | 15 | −350 | 10 | |
| 44 | 6 | 40 | 0 | 0 | 0 | *300 | 100 | uniformly sloping sidewalls; elimination of dovetailing; formation of less black silicon; elimination of nonuniformity across wafer; necking; rounded trench bottom. |
| 63 | 6 | 30 | 35 | 15 | 0 | −350 | 10 | straight sidewalls; trenching; rounded trench bottom; bowing. |
| 91 | 6 | 0 | 75 | 15 | 0 | −475 | 10 | vertical, straight sidewalls; rounded trench bottom. |
| 102 | 6 | 0 | 75 | 15 | 0 | −400 | 10 | |
| ** | 6 | 0 | 100 | 15 | 0 | −450 | 10 | |

*power in watts
**final etch conditions

TRIAL 1

Initially, a combination of $BCl_3/Cl_2$ was used to etch trenches in silicon. The trenches produced during this initial phase were characterized by "irregular" sidewall profiles, "dovetail" bottoms, "black silicon," and nonuniformity across the wafer. Each of these problems will be described in more detail below. The $BCl_3/Cl_2$ etch was preceded by a brief $BCl_3$ etch at high pressure (20 mT) and low power (−200 V d.c. bias). This initial etch acts as a chamber conditioner. After etching the oxide layer to expose portions of the substrate, some oxide may form on the silicon surface to be etched. At the same time, after the etch chamber is purged there may be some residual contaminants (e.g. water) present. The initial $BCl_3$ etch will remove any oxides from the silicon substrate, while also gettering any contaminants present in the chamber. While this process step is shown separately as the first step in Trial 1, it is to be understood that this same initial $BCl_3$ etch precedes all of the trial etch steps shown in Table 1. That is, this initial etch is used in conjunction with the etch process of the inventrench etch chemistry. Therefore, silicon regions beneath these particles will not be etched, resulting in a roughened topography. This roughened surface will not reflect incident light, such that the trench bottom will appear to be black when viewed through an optical monitor. Finally, all of the tested wafers exhibited nonuniform etch characteristics as a function of position. The trenches formed in the center of the wafer had a wide, dovetailed trench bottom, while those formed at the edges of the wafer had sidewalls that came together to form a narrow tapered trench bottom.

For various reasons, each of the above four problems must be eliminated from the trench etch process. The subsequent runs were specifically addressed at overcoming these problems.

TRIAL 44

The first breakthrough occurred at Trial 44, which resulted in uniform trench sidewall profiles. Leading up to this, some additional gas components were studied. Adding 20% oxygen in argon to the $BCl_3$ and $Cl_2$ etch gases resulted in a 15% faster etch rate, but also resulted in heavy black silicon. Replacing $BCl_3$ with HCl gas in the main etch step doubled the silicon etch rate. In Trial 44, a second step with BCl3 and Cl2 at high pressure (100 mTorr) and 300 Watts was added, along with the new gas mixture (HCl, Cl2, and Ar/O2), to make a trench with slightly sloping sidewalls and the desired rounded bottom. Non-uniform etch profiles across the wafer were eliminated. There was, however, some narrowing or "necking" of the trench sidewall near the silicon-silicon oxide interface. Some roughness at the bottom resulting from black silicon formation was still present in the trench profiles. Although the profile was beginning to look more uniform, the trench could not be refilled satisfactorily without voids. Something would have to be done to avoid necking and to eliminate black silicon.

TRIAL 63

Several changes were made from Trial 44 leading up to Trial 63. Pure oxygen replaced the argon/oxygen gas mixture of Trial 44. The second step in Trial 44 was eliminated. Finally, a small amount of BCl3 was added. In Trial 63, the necking problem observed in Trial 44 was substantially eliminated. Also, the addition of BCl3 and the deletion of argon seemed to combine to eliminate black silicon formation. The only remaining problem was some "trenching" that was observed at the bottoms of the trenches. This term refers to an etch profile in which a small portion of an otherwise planar etched surface is etched deeper into the material. In other words, a small, spiked space extends downward from either end of the bottom of the trench. It was subsequently found that trenching could be eliminated by increasing the d.c. bias; however, this led to a "bowing" in the trench sidewalls. The term "bowing" refers to a trench profile in which the trench sidewalls have a concave shape, or are bowed outward.

TRIAL 92

Between Trials 63 and 91, the d.c. bias was incrementally raised by increasing the magnitude of the anode-cathode d.c. bias differential, and the gas flows were varied. In general, as the d.c. bias was raised above −350 V, the trenching problem was reduced and eventually eliminated at −475 V. However, at this applied voltage the bowing problem became more severe. This problem was addressed by decreasing the Cl2 flow and increasing the HCl flow. In Trial 91, the Cl2 flow was reduced to zero and the HCl flow was increased to 75 SCCM. Surprisingly, it was only when the Cl2 flow was eliminated that the bowing problem was substantially eliminated. The only remaining problem was a residual amount of necking.

TRIAL 102

In the trials after Trial 91, different modifications were made in an attempt to eliminate necking. At Trial 98, it was noted that some residue from the oxide layer above the trench may have deposited on the upper surfaces of the trench to induce the observed necking phenomena. In the experimental wafers upon which the trench etch had been carried out, the thick oxide layer had been left in place after the trench had been etched. It is believed that at the latter stages of the etch, by-products of the silicon oxide removed during the etch may have redeposited on the upper portions of the trench sidewalls. Due to this trench residue problem, after Trial 98 the thick oxide layer was removed immediately after the trench etch by exposing the wafer to a buffered hydrofluoric (BHF) wet etchant. It was found that this eliminated bowing, such that the resulting trenches had vertical, straight sidewalls and a rounded bottom. Moreover, by removing this thick oxide layer, it was found that the applied power could be reduced from −475 V to −400 V without a reoccurrence of the trenching problem.

Using the Trial 102 conditions as a base, a series of experiments were then undertaken to perceive how the process parameters could be varied while achieving the desired trench profile. For example, as would be expected, increasing the applied power increases the silicon etch rate. However, further experiments confirmed that at −400 V, some dovetailing (i.e., a small degree of trenching) resulted in some of the trenches. At a power greater than −475 V, the etch rate increases without affecting the etched profile (i.e., trenching is eliminated). A power of −450 V was selected in order to eliminate trenching while also keeping the applied bias as low as possible. With regard to pressure, when the applied pressure was decreased to 5 mT, the etch rate decreased by 29% without affecting the etched profile. At 20 mT, the process could not be sustained because the power requirement exceeded the maximum RF of the tool.

Varying the gas flows produced intriguing results. By raising the HCl flow rate from 75 SCCM to 100 SCCM, the etch rate increases by 4% without adversely affecting the etched profiles. If the HCl flow is dropped to 50 SCCM, long trench spikes form (i.e., grossly exaggerated black silicon roughening). If the HCl flow is increased to 125 SCCM, the sidewalls of the trenches become somewhat bowed. Raising the oxygen flow by 5 SCCM has no apparent effect on trench profiles or etch rate, but it does create black silicon in the large open areas of the pattern. Conversely, a 5 SCCM lower oxygen flow destroys the trench profile, leaving huge silicon spikes.

A particularly intriguing result was achieved by varying the BCl3 supply rate. When BCl3 was eliminated from the process, no trench was formed. That is, without BCl3, apertures of only 1-2 μm were formed, having irregular, spiked profiles. When the BCl3 flow rate was raised from 6 SCCM to 10 SCCM, dovetailing was introduced at the bottom of the trench. These results tend to indicate that the main function of BCl3 is to remove oxides as they form on the trench bottom while allowing boron oxides to form on the trench sidewalls in order to produce a near anisotropic profile at a minimum etch bias.

Therefore, the process conditions would appear to be variable within the following ranges:

| | | |
|---|---|---|
| BCl3 | ~1 < X | SCCM < 10 |
| HCl | 50 < Y | SCCM < 125 |
| O2 | 10 < Z | SCCM < 20 |
| Bias | 400 < A | Volts < ? |
| Pressure | ~10 < B | mTorr < 20 |

With the etch process parameters being controlled within the above ranges (and optimized as indicated in the last line of Table 1), the silicon trench etch has the following attributes. Approximately 1000 Å–1500 Å of the silicon oxide layer is removed during the trench etch. Moreover, experiments showed that if a 1500 Å oxide mask is used, dovetailing is produced at the bottom of the trench. Therefore, it appears that the oxide mask should be at least on the order of 2000 Å in thickness. The etch bias achieved by the process of the present invention averages roughly less than 0.025 μm, which is extremely small. The aspect ratio achieved by the process of the present invention is approximately 8:1 to 15:1, typically about 9:1.

Accordingly, the present invention provides a trench etch process in which deep trenches are formed in monocrystalline silicon substrates. The trenches are characterized by sidewalls having a substantially vertical slope and rounded trench bottoms. The trench etch exhibits a high aspect ratio and a minimum of etch bias.

It would appear that the small amount of $BCl_3$ is of particular importance in the etch chemistry of the invention. Other compounds based on a carbon, boron, or silicon base atom linked to a plurality of higher halogen atoms (e.g. chlorine, bromine, etc.) should perform the functions of $BCl_3$ in the etch chemistry of the invention. The term "higher halogens" refer to halogens other than hydrogen or fluorine. A fluorine-containing compound would have a low silicon-to-silicon oxide etch rate ratio, causing substantial mask erosion and discontinuities in the trench profiles. More particularly, carbon-chloride compounds such as carbon tetrachloride ($CCl_4$) would seem to be of use in the present invention. However, $BCl_3$ is preferred, in that it posesses optimized oxide etch and impurity gettering properties that are of particular importance to the present invention.

It is to be understood that various modifications can be made to the present teachings, without departing from the spirit and scope of the present invention as recited in the several claims appended hereto.

We claim:

1. A process for etching portions of a monocrystalline silicon material so as to form trenches having sidewalls and bottoms therein, comprising the step of treating the material in a reactor having a gaseous plasma comprised of more than 70% hydrogen chloride, oxygen, and an amount of boron trichloride sufficient to remove oxides formed during said etching process from bottoms of said trenches without substantially removing oxides formed during said etching process from sidewalls of said trenches.

2. The process as recited in claim 1, wherein said plasma is comprised of 75%–86% HCl, 9%–16% $O_2$, and 1%–8% $BCl_3$.

3. The process as recited in claim 2, wherein said reactor is biased at a voltage of at least −400 volts during said treatment step.

4. The process as recited in claim 3, wherein said reactor is biased at a voltage within the range of −450 to −475 volts during said treatment step.

5. The process as recited in claim 2, wherein said reactor pressure is within the range of 5 to 20 mTorr during said treatment step.

6. The process as recited in claim 5, wherein said reactor pressure is 10 mTorr during said treatment step.

7. A process for etching trenches in a silicon substrate, comprising the steps of:
forming a masking layer on the substrate so as to expose portions of the substrate in which the trenches are to be formed; and
treating the substrate in a plasma reactor having a plasma comprising more than 70% hydrogen chloride, oxygen, and approximately 1%–10% boron trichloride.

8. The process as recited in claim 7, wherein said plasma comprises 75%–86% HCl, 9%–16% $O_2$, and 1%–$BCl_3$.

9. The process as recited in claim 8, wherein said reactor has a bias at not less than −400 volts and a pressure of not less than 10 mTorr during said treatment step.

10. The process as recited in claim 7, wherein said masking layer is not totally eroded during said treatment step.

11. The process as recited in claim 10, wherein said masking layer has an etch rate ratio of 1:50 with respect to the silicon substrate in said plasma.

12. The process as recited in claim 11, wherein said masking layer is comprised of silicon oxide.

13. A process for etching deep trenches in a silicon substrate, said trenches having substantially vertical sidewalls and a rounded bottom surfaces, comprising the steps of:
forming a masking layer on the substrate;
depositing and patterning a photolithographic material on said masking material, so as to expose selected area of said masking material;
etching said selected areas of said masking material through said photolithographic material, so as to form apertures in said masking material that expose selected areas of said substrate;
exposing said selected areas of the substrate to a first plasma etchant that removes residual surface oxides and getter impurities; and
exposing said selected areas of the substrate to a second plasma etchant comprising more than 70% hydrogen chloride, oxygen, and approximately 1%–10% boron trichloride.

14. The method as recited in claim 13, wherein said first plasma etchant comprises boron trichloride.

15. A process for etching trenches at least 6 μm deep into a surface of a silicon substrate, the trenches having substantially vertical sidewalls and rounded bottom surfaces, comprising the steps of
forming a masking material on the substrate that exposes selected areas thereof;
etching said selected areas in a first boron trichloride plasma for not more than five minutes, in order to remove residual oxides and getter impurities; and
etching said selected areas in a second plasma having a gas flow of at least approximately 75% hydrogen chloride, at least approximately 9% oxygen, and at least approximately 1% boron trichloride.

16. The process as recited in claim 15, wherein said plasma has a gas flow of 100 SCCM HCl, 15 SCCM $O_2$, and 6 SCCM $BCl_3$.

17. The process as recited in claim 16, wherein said second plasma is generated in a reactor having a bias of −450 volts and a pressure of 10 mTorr.

18. The process as recited in claim 15, wherein said first plasma has a gas flow of approximately 50 SCCM $BCl_3$, said first plasma being generated in a reactor having a bias of −200 volts and a pressure of 20 mTorr.

* * * * *